United States Patent
Dubarry et al.

(10) Patent No.: US 11,152,646 B2
(45) Date of Patent: Oct. 19, 2021

(54) PRODUCTION OF A MICROELECTRONIC DEVICE COLLECTOR

(71) Applicant: Commissariat A L'Energie Atomique et aux Energies Alternatives, Paris (FR)

(72) Inventors: Christophe Dubarry, Claix (FR); Olivier Zanellato, Chambery (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 204 days.

(21) Appl. No.: 16/226,691

(22) Filed: Dec. 20, 2018

(65) Prior Publication Data
US 2019/0207263 A1    Jul. 4, 2019

(30) Foreign Application Priority Data

Dec. 21, 2017 (FR) .................................... 17 62742

(51) Int. Cl.
*H01M 10/0585* (2010.01)
*H01G 11/70* (2013.01)
(Continued)

(52) U.S. Cl.
CPC ......... *H01M 10/0585* (2013.01); *C23C 14/24* (2013.01); *C23C 14/5806* (2013.01);
(Continued)

(58) Field of Classification Search
None
See application file for complete search history.

(56) References Cited

U.S. PATENT DOCUMENTS 6,455,202 B1    9/2002 Marugan et al.
6,671,165 B1    12/2003 Nakazawa et al.
(Continued)

FOREIGN PATENT DOCUMENTS

EP    1 032 064 A1    8/2000
EP    1 746 674 A1    1/2007
(Continued)

OTHER PUBLICATIONS

French Preliminary Search Report dated Sep. 4, 2018 in French Application 17 62742, filed on Dec. 21, 2017 (with English translation of categories of cited documents).
(Continued)

*Primary Examiner* — Daniel S Gatewood
(74) *Attorney, Agent, or Firm* — Oblon, McClelland, Maier & Neustadt, L.L.P.

(57) ABSTRACT

The present invention relates to a method for producing a microelectronic device, successively including:
forming a first current collector on a face of a substrate;
forming a first electrode on, and in electrical continuity with, a portion of the first current collector;
heat treating the first electrode wherein:
forming the first collector comprises forming a first collector layer on the face of the substrate and forming a second collector layer covering at least one part to produce a covered part of the first collector layer and having a first face in contact with the first electrode,
the second collector layer is configured to protect the covered part during the heat treating, such that the heat treating does not oxidise the covered part.

22 Claims, 3 Drawing Sheets

(51) Int. Cl.

| | | |
|---|---|---|
| H01G 11/68 | (2013.01) | |
| H01G 11/84 | (2013.01) | |
| H01M 10/0562 | (2010.01) | |
| H01G 11/06 | (2013.01) | |
| H01C 10/10 | (2006.01) | |
| H01G 11/28 | (2013.01) | |
| C23C 14/24 | (2006.01) | |
| C23C 14/58 | (2006.01) | |
| H01G 9/00 | (2006.01) | |
| H01G 9/04 | (2006.01) | |
| H01M 4/04 | (2006.01) | |
| H01L 41/047 | (2006.01) | |
| H01L 41/29 | (2013.01) | |

(52) U.S. Cl.
CPC ........... *H01C 10/10* (2013.01); *H01G 9/0029* (2013.01); *H01G 9/04* (2013.01); *H01G 11/06* (2013.01); *H01G 11/28* (2013.01); *H01G 11/68* (2013.01); *H01G 11/70* (2013.01); *H01G 11/84* (2013.01); *H01M 4/0423* (2013.01); *H01M 4/0471* (2013.01); *H01M 10/0562* (2013.01); *H01L 41/047* (2013.01); *H01L 41/29* (2013.01)

(56) References Cited

U.S. PATENT DOCUMENTS

| 2007/0020524 A1* | 1/2007 | Kim .................. H01M 4/62 429/245 |
|---|---|---|
| 2007/0218333 A1* | 9/2007 | Iwamoto .............. C22C 38/40 429/122 |
| 2010/0129717 A1 | 5/2010 | Bedjaoui et al. |
| 2012/0043120 A1 | 2/2012 | Gadkaree et al. |
| 2012/0260478 A1 | 10/2012 | Kuriki |
| 2016/0268595 A1 | 9/2016 | Miki |
| 2017/0330699 A1 | 11/2017 | Buffry et al. |

FOREIGN PATENT DOCUMENTS

| EP | 2 130 251 A1 | 12/2009 |
|---|---|---|
| EP | 2 192 638 A1 | 6/2010 |
| FR | 3 028 088 A1 | 5/2016 |
| JP | 9-306505 | 11/1997 |
| WO | WO 03/005477 A2 | 1/2003 |
| WO | WO 2005/010155 A2 | 2/2005 |
| WO | WO 2008/011061 A1 | 1/2008 |
| WO | WO 2008/116694 A1 | 10/2008 |

OTHER PUBLICATIONS

Oukassi S., et al. "Elaboration and characterization of crystalline RF-deposited $V_2O_5$ positive electrode for thin film batteries", Applied Surface Science, (2009), 7 pages.

Kanehori K., et al. "Thin Film Solid Electrolyte and its application to secondary lithium cell", Solid State Ionics, (1983).4 pages Chae, C, et al. "A Li-Ion battery using Li $Mn_2O_4$ cathode and $MnO_x$/C anode", Journal of Power Sources 244, (2013), 8 pages Billaud, J, et al. "ß-NaMnO2: A high-pertormance cathode for sodium-ion batteries", J. Am. Chem. Soc., 136, (2014), 6 pages.

R. Berthelot, et al. "Electrochemical investigation of the P2-NA$_x$CoO$_2$ phase diagram", Nature Materials 10, (2011), 7 pages.

K. Takada, et al. "Solid State lithium battery with oxysulfide glass", Solid State Ionics. (1996) 6 pages.

R. Komiya, et al. "Solid State lithium secondary batteries using an amorphous solid electrolyte in the system ( 100-x) (0.6Li$_2$S.0.4SiS$_2$)-xLi$_4$SiO$_4$ obtained by mechanochemical synthesis", Solid State Ionics.140 (2001), 5 pages.

N. Machida, et al. "All-Solid-State Lithium Battery with LiCo$_{0.3}$ Ni$_{0.7}$ O$_2$ fine powder as cathode materials with an amorphous sulfide electrolyte", J. Electrochem. Soc. 149 (2002), 6 pages Tatsumisago, M, et al. "Supersonic glasses and glass-ceramics in the Li$_2$S-P$_2$S$_5$ system for all-solid-state lithium secondary batteries", Solid State Ionics 225 (2012) , 4 pages.

F. Mizuno et al. "New, Highly ion-Conductive Crystals Precipitated from Li$_2$S-P$_2$S$_5$ glasses", Adv. Mater. 17 (2005), 4 pages.

Hayashi, A et al., "Supersonic Glass-ceramic electrolytes for room-temperature rechargeable sodium batteries", Nature Communications 3 (2012), 5 pages.

\* cited by examiner

A-A

A-A

A-A

PRODUCTION OF A MICROELECTRONIC DEVICE COLLECTOR

FIELD OF THE INVENTION

The present invention relates to microelectronic devices having electrode and current collector parts, for example in the field of storing energy electrochemically, but also for example in active layer stacks like piezoelectric layers, in particular to produce sensors or actuators.

The invention has a particularly advantageous, but non-limiting, application in the production of microelectronic devices. By microelectronic device, this means any type of device produced with microelectronic means. These devices in particular comprise, in addition to devices for purely electronic purposes, micromechanical or electromechanical devices (MEMS, NEMS, etc.) as well as optical or optoelectronic devices (MOEMS, etc.).

A specific, non-limiting interest of the invention is the production of electrochemical energy storage devices. This includes, in particular, the devices of the battery, accumulator or condenser type using an electrolyte.

TECHNOLOGICAL BACKGROUND

By referring, in particular to electrochemical energy storage systems, these are generally produced by successive deposits on a substrate of a first current collector, of a first electrode, of an electrolyte or ionic conductor, of a second electrode, and of a second current collector. An encapsulation, by means of depositing of additional layers, or by extension of cover, is often necessary to protect the system of chemical reactivity with oxygen and water vapour.

The migration of one or more ions between the two electrodes through the electrolyte makes it possible either to store energy or to deliver towards an outer circuit.

More specifically, as FIGS. 1 and 2 illustrate, this type of system is produced on a substrate (for example, made of glass or silicon) and comprises in the stack: an insulating layer 6 if the substrate is electrically conductive, a first current collector 1, a first electrode 3, an electrolyte or ionic conductor, a second electrode 4, and a second current collector 2. FIG. 1 also shows an encapsulation produced by an electronic insulating layer 5 and, possibly, an encapsulation by a final metal layer. In FIG. 2, the current collectors 1, 2, each connected to a different one of the electrodes, are accessible through the outside of the stack of the electrochemical storage device, for a re-contact. The first electrode 3 (or positive electrode used in a conventional lithium or sodium accumulator) is potentially usable in a microbattery and examples of materials are moreover numerous, like: $LiCoO_2$, $V_2O_5$, $TiS_2$, $LiMn_2O_4$, $NaMnO_2$, $NaCoO_2$, etc.

The solid electrolyte or glass-based superionic materials are among the best candidates for inorganic solid electrolytes applicable to any totally solid battery. A large choice of sulphur and oxysulfide electrolyte vitreous systems has been developed, as well as a series of superionic glass/ceramic sulphide $Li_2S$—$P_2S_5$, of which the $Li^+$ ion conductivity is comparable to that of liquid electrolytes. Concerning the electrolyte for sodium batteries, there is the same glass family, for example $Na_3PS_4$.

This type of component has the disadvantage of having at least one high-budget thermal step during the technological method thereof. In particular, in the case of materials stated above for the formation of the first electrode, generally a thermal oxidation under air or under dioxygen is carried out, of which the purpose is to crystallise the material of the first electrode; frequently, the temperatures of this heat treatment are between 500 and 700° C. This particularity conditions restrictive specifications on the first current collector. Indeed, the current collector must conserve the electrical conduction properties thereof after a treatment at an increased temperature under an oxidising atmosphere. Conventionally, the material used is platinum, an expensive material, by capable of conserving the electrical conduction properties thereof after the heat treatment through the almost-zero oxidisability thereof. When other materials are used, the degradation in the effectiveness of the microelectronic device is significant because of the oxidation of the conductive parts induced by the heat treatment.

Therefore, there is currently a need for an improved production of devices comprising a collecting part and an electrode part supported by a substrate. It is an aim of the invention to overcome, at least partially, the disadvantages of the current techniques to do this.

SUMMARY OF THE INVENTION

A non-limiting aspect of the invention relates to a method for producing a microelectronic device successively comprising:
  a formation of a first current collector on a face of a substrate;
  a formation of a first electrode on, and in electrical continuity with, a portion of the first current collector;
  a heat treatment configured to treat the first electrode.

Advantageously, the formation of the first current collector comprises a formation of a first collecting layer on the face of the substrate and a formation of a second collecting layer covering at least one part, called covered part, of the first collecting layer and having a first face in contact with the first electrode, the second collecting layer is configured to protect the covered part during the heat treatment, such that the heat treatment does not oxidise said covered part.

The approach of the invention proposes a new current collecting structure comprising two parts; an electrically conducting part constituted of an increased electronic conductivity material and a second part, superposed to the first, being used to protect against oxidation.

The constitution of such a stack is justified by the desire to separate the electronic conduction and resistance to oxidation functions. Indeed, it is proposed to produce a stack which will make it possible to protect the electronic conduction function during the significant heat budget steps used for the crystallisation or the optimisation of the first electrode. According to an aspect, the invention makes it possible to limit or avoid resorting to expensive materials, in particular platinum, often used as a collector because of the stainless character thereof.

Another aspect which can be separated from the present invention relates to a microelectronic device comprising in a stack on a face of a substrate of a first current collector, a first electrode, an active layer, a second electrode and a second current collector, characterised by the fact that the first collector comprises a first collecting layer in contact with the face of the substrate and a second collecting layer covering at least one part, called covered part, of the first collecting layer and having a first face in contact with the first electrode and in that the second collecting layer is configured to protect the covered part against oxidation.

BRIEF INTRODUCTION OF THE FIGURES

Other characteristics, aims and advantages of the present invention will appear upon reading the following detailed description, opposite the appended drawings, given as examples, non-limiting, and on which:

FIGS. 3 to 9 present successive steps of a non-limiting embodiment of the invention.

The drawings are given as examples and are not limiting of the invention.

They constitute schematic representations of principle, intended to facilitate the understanding of the invention and are not necessarily to the scale of practical applications. In particular, the relative thicknesses of the layers are not representative of reality.

DETAILED DESCRIPTION

It is specified that, in the scope of the present invention, the term "on" or "above" does not compulsorily mean "in contact with". Thus, for example, the depositing of a layer on another layer, does not compulsorily mean that the two layers are directly in contact with one another, but this means that one of the layers covers the other at least partially, by being, either directly to the contact thereof, or by being separated from it by a film, or also another element. A layer can moreover be composed of several sublayers of one same material or of different materials.

It is specified that in the scope of the present invention, the thickness of a layer or of the substrate is measured along a direction perpendicular to the surface according to which this layer or this substrate has the maximum extension thereof.

Certain parts of the device of the invention can have an electrical function. Some are used for electrical conduction properties and by electrode, this means a collector or equivalent, elements formed of at least one material having a sufficient electrical conductivity, in the application, to achieve the desired function. Conversely, by electrical or dielectric insulator, this means a material which, in the application, ensures an electrical insulation function.

According to the invention, a microelectronic device is produced, comprising at the very least, on a substrate, a first current collector is a first electrode. In the sense of the present application, the term "collector" extends to a part of the device having the function of connecting an electrode, an outer element, to the device, i.e. situated outside of the stack of layers of the device, generally encapsulated. The term "electrode" itself extends to a part of the device in electrical continuity with an active layer (in particular, an electrolyte, preferably solid, for the case of the electrochemical storage or also a piezoelectric layer, for example). The current collector is connected to the electrode thereof so as to establish an electrical continuity between the two parts; the latter can furthermore come from one or more common layers of materials; in this case, the collector will generally form an excrescence of the electrode, towards the outside of the encapsulated device.

Figure 9:
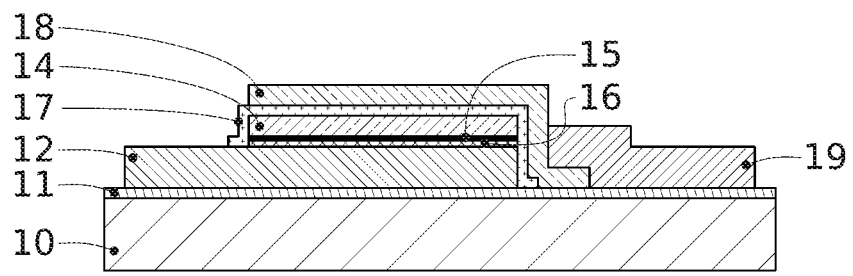

Generally, the storage system of the invention, of which one example can be seen in FIG. 9, comprises a stack of layers making it possible to produce different components of an electrochemical storage member, comprising a stack, itself comprising a first collector 12, 15, 16 (the layer 16 making it possible to protect the remainder of the first oxidation collector), a first electrode 14, an electrolyte 17, a second electrode 18 and a second collector 19. The electrolyte is a portion inserted between the two conductive portions, separated and constituted respectively from the first collector and from the first electrode, and from the second electrode and from the second collector. Ionic exchanges between these two conductive portions are operated through the electrolyte, advantageously solid, according to the electrochemical energy storage principle.

To achieve the result of FIG. 9, below, a method according to the chronology of FIGS. 3 to 8 is described.

The invention can be implemented based on a substrate 10 made of any material, and in particular those used in the field of microelectronics, for example, semi-conductors such as silicon. If the substrate 10 is of an electrically conductive nature, preferably here an electrically insulating layer 11 is associated, of which the exposed face will receive the stack constituting the electrochemical device. Thus, in FIG. 3, a transversal cross-section illustrating such a substrate 10 with a dielectric layer 11 has been represented, above which a first layer 12 of first collector is formed. Typically, for the depositing of this layer and, advantageously for the depositing of other layers of the stack, a physical vapour deposition phase (PVD) technique can be used. All the is electrically conductive materials can be suitable, like Ti, Cu, W, MoSi or a FeCr, FeCrX (Al, Si, Ni, etc.) alloy, by being advantageously inexpensive (in particular, by avoiding platinum). For example, the thickness of the first layer 12 of the collector can be greater than or equal to 50 nm, preferably greater than or equal to 100 nm even greater than or equal to 200 nm. The thickness thereof can, for example, be less than or equal to 2 microns. The electrical resistivity of this part can be less than or equal to $50.10^{-6}$ $\Omega$.cm, preferably less than or equal to $30.10^{-6}$ $\Omega$.cm, is possibly greater than or equal to $10.10^{-6}$ $\Omega$.cm.

Figure 1:
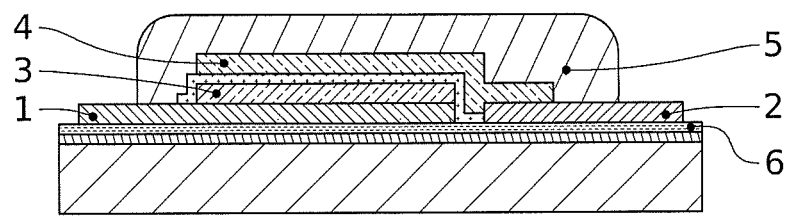
FIG. 1 illustrates in a cross-section, according to the thickness of the substrate, an electrochemical storage device example according to the state of the art.
Figure 2:
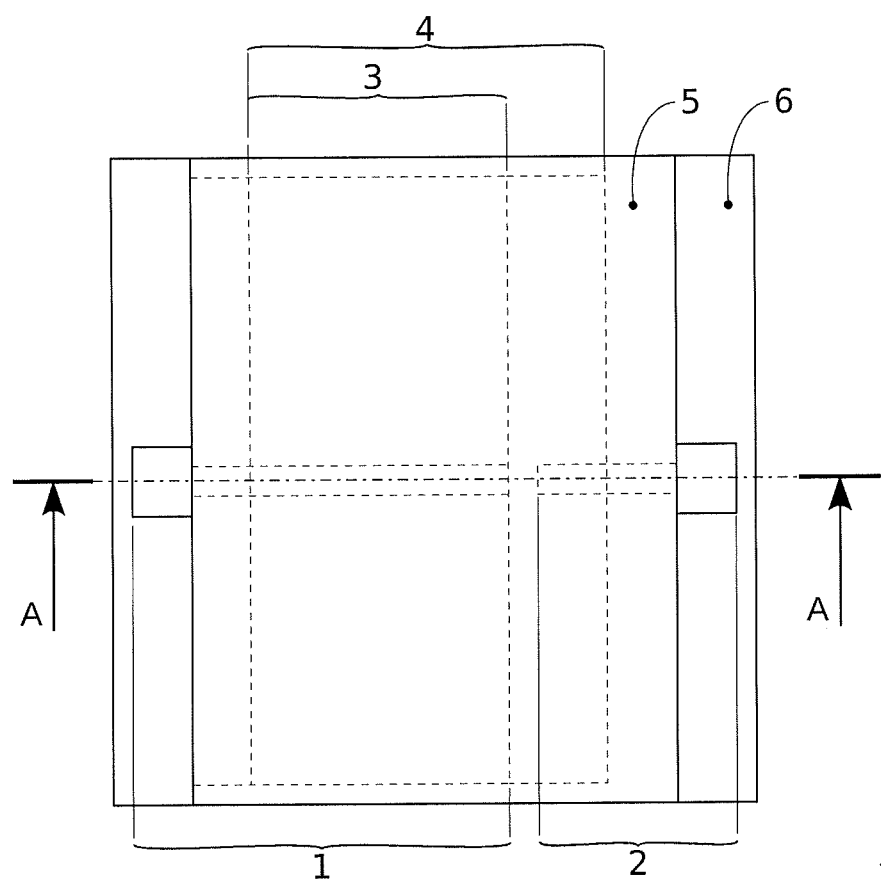
FIG. 2 shows a top view of it.
Figure 3:
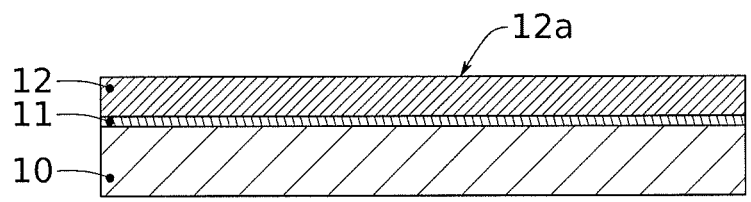
Figure 4:
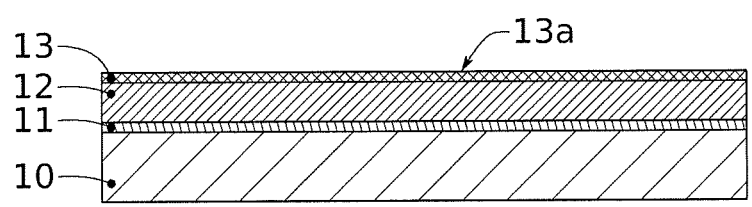

The exposed face 12a of the first layer 12 thus receives, such as represented in FIG. 4, a second collector layer 13. In the example represented, the covering is complete, the deposits being made as a solid plate. However, it is not absolutely necessary that the layer 13 fully covers the layer 12; indeed, this covering can only relate to a zone of the first collector layer 12 opposite which the first electrode will be situated.

The second layer 13 is used to protect against oxidation. Indeed, this material has the role of preventing the oxidation of the material of the underlying collector layer, while keeping an electronic conduction. This material cannot therefore be an electrical insulator, but can be selected from nitride-type, electronically conductive oxide-type materials, or materials forming a weak oxide layer after oxidation. It can in particular be FeCrAl, FeCrAlN, TiAlN, CrN, Cr2-xN. This material will be of thickness as thin as possible, so as to slightly impact the resistance inside the component. Thus, advantageously, the thickness of the second layer 13 is less than that of the first layer 12; for example, the thickness of the layer 13 is less than 30 nm even less than 20 nm (it is possibly greater than 5 nm). Advantageously, the second layer 13 is at least five times (and possibly at least ten times) thinner than the first layer 12. Generally, a material of which the electrical resistivity is greater than that of the material of the layer 12 can be used as a material for the second layer 13. For example, a material having an electrical resistivity greater than or equal to $10^6$ $\Omega$.cm can be selected. The low thickness of the second layer 13 makes it possible to limit the increase in electrical resistivity of the first collector in its entirety. For example, the electrical resistance induced by the second collector can be less than 3 ohms.

Below, a table is given, showing a few material couples of first layer and of second layer of first collector which could be used:

|  | First layer 12 | Second layer 13 |
| --- | --- | --- |
| Case 1 | Cu | FeCrAl |
| Case 2 | Ti | Cr2-xN |
| Case 3 | FeCrAl | FeCrAlN |
| Case 4 | FeCrAl | Cr2-xN |

Figure 5:
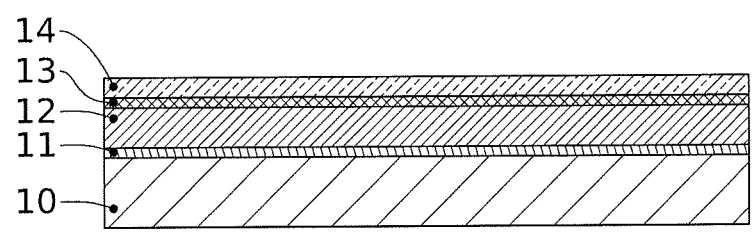

Then comes the phase of forming the first electrode, thanks to the deposit of a first electrode 14 layer as illustrated in FIG. 5. Generally, the positive electrode can be made of LICO (contraction of the term Lithium-Cobalt); it can be deposited by PVD, in order to obtain a layer thickness, in particular of between 3 μm and 20 μm.

Figure 6:
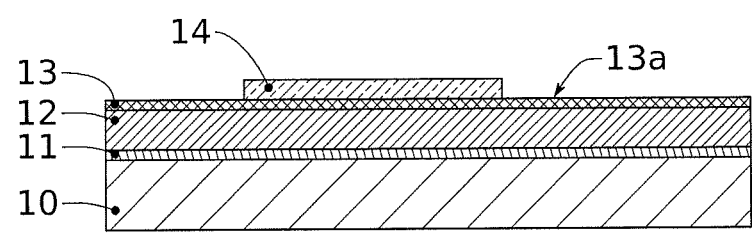
Figure 7:
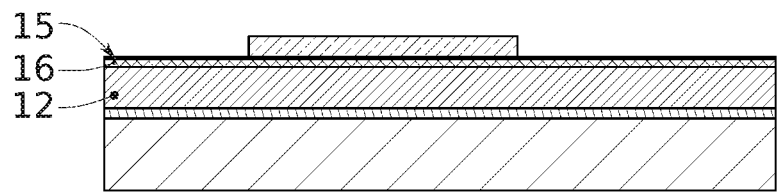

A photolithography step, as well as a wet engraving step, make it possible for the production of a first electrode 14 pattern, such as represented in FIG. 6. In this configuration, the lower face of the first electrode 14 in contact with the upper face 13a of the second layer 13 of first collector; the remainder of the upper face 13a is exposed. The engraving is done, for example, in a $H_2SO_4/H_2O_2/H_2O$ (1/5/32) bath, the engraving speed being of around 6 μm/min.

As indicated above, the production of the first electrode 14 involves, according to the invention, a heat treatment. It must be noted that the latter can possibly be achieved before the shaping of the first electrode pattern, that is before the step illustrated in FIG. 6. The heat treatment can be an annealing under oxidising atmosphere at a temperature greater than or equal to 300° C., possibly greater than or equal to 500° C., even greater than or equal to 700° C. From this treatment, the crystalline structure of the first electrode is fixed, but this also has induced a modification of the material of the second layer 13 of first collector, at the level of the upper face 13a thereof, as FIG. 7 indicates, by the dark portion reference 15 surmounting a non-modified underlying portion 16 from the initial layer 13. It is not absolutely essential that an underlying portion 16 exists: all of the thickness of the second layer 13 can be oxidised, for example, with a heat treatment under air of 600° C. for 2 hours, for a second layer 13 material constituted of 30 nm of $Cr_{2-x}N$. However, it must preferably be, that the oxidation induced by the heat treatment of the electrode 14 does not affect the first layer 12. Advantageously, the layer 15 can form a passivation film protecting the underlying part of the first collector. With the layer 13 being thin, the modified layer 15 is, as a maximum, of the same thickness and preferably thinner, if although the thickness of the layer 15 can be, in practice, of less than 10 nm, so as to not greatly impact the overall electrical resistance of the collector.

Figure 8:
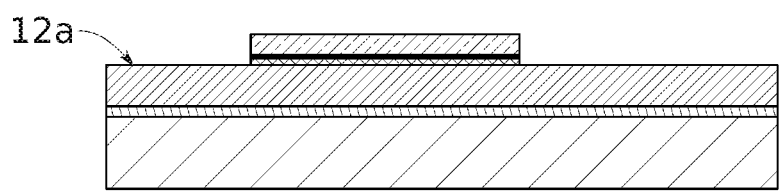

The step of FIG. 8 which is optional, shows a lifting of the second layer 13 at this step formed of the oxidised layer 15 and of the underlying layer 16 in the parts of the surface of the stack not covered by the first electrode 14. Any common engraving method can be used, for this purpose. This, in particular, makes it possible to electrically connect the first collector to an external member, for example, a re-contact element, by way only of the material of the first layer 12, for example by contact at the level of the exposed portion of the face 12a of this first layer, again easily accessible and benefiting an electrical resistivity less than the second layer of first collector.

By PVD deposit in particular, the electrolyte 17, preferably made of LiPON, as well as the negative electrode 18, for example made of silicon, and the second collector 19, for example made of Ti, will be deposited successively. These portions can, at this stage, be shaped. For example, a photolithography will make it possible to localise the future patterns of these parts, which will then be created by a plasma, in particular of $Ar/O_2/CHF_3$, at 40 T of pressure, under a power RF of 280 W and a power LF of 400 W (engraving speed of around 0.7 nm/min). FIG. 9 gives a result of it.

Except for any specific indication on the contrary, the technical characteristics described in detail for a given embodiment can be combined with the technical characteristics described in the context of other embodiments described as an example and in a non-limiting manner, of which those explained in detail above.

The example given in reference to the drawings falls into the field of electrochemical energy storage, by using an electrolyte, advantageously in the form of solid ionic conductor. However, other microelectronic devices are concerned by the present invention, by implementing equivalent steps to produce the first collector and the first electrode, the following steps could vary according to the application. For example, the invention can be applied to active layers of an electroactive nature, in particular piezoelectric, in sensors or in actuators, in particular. The electrolyte is therefore thus replaced by a piezoelectric layer then covered by the second electrode and by the second collector.

Furthermore, the detailed review which precedes embodiments of the invention, are stated below of the optional characteristics which can possibly be used according to any association or alternatively:

The heat treatment is configured to oxidise, at most, the thickness of the second collector layer 13 from the first face thereof so as to form an oxide layer 16 in the second collector layer 13, without oxidising the covered part.

Advantageously, the material of the second collector layer 13 is selected as less oxidisable than the material of the first collector layer 12.

Optionally, the thickness dimension of the first collector layer 12 is selected as strictly greater than that of the second collector layer 13, and preferably the first layer (12) is 4 to 6 times greater than the second layer (13).

According to a non-limiting example, the thickness of the second collector layer 13 is less than or equal to 20 nm.

Preferably, a material is selected for the second collector layer 13 having an electrical resistivity greater than that of the material of the first collector layer 12.

According to a preferred embodiment, the second collector layer 13 is configured to form a passivation layer during the heat treatment.

Advantageously, the heat treatment is a heat oxidation, at a temperature greater than or equal to 300° C., and preferably greater than or equal to 500° C.

Advantageously, the formation of the second collector layer 13 is configured to totally cover the first collector layer 12.

Preferably, the method comprises a removal of the second collector layer 13, after the formation of the first electrode 14, on at least one part of the second collector layer not covered by the first electrode 14.

According to an example, the method comprises, after the heat treatment, a formation of an active layer in contact with an upper face of the first electrode 14, a formation of a second electrode 18 in contact with an upper face of the active layer and a formation of a second collector 19 in electrical continuity with the second electrode 18.

The invention claimed is:

1. A method for producing a microelectronic device successively comprising:
   forming a current collector on a face of a substrate by (a)
      forming a first collector layer on the face of the substrate and (b) forming a second collector layer covering at least part of the first collector layer to produce a covered part of the first collector layer;

forming a first electrode on, and in electrical continuity with, a first face of the second collector layer of the current collector; and heat treating the first electrode such that the second collector layer protects the covered part during the heat treating and prevents the heat treating from oxidizing the covered part by oxidizing from the second collector layer at most a thickness of the second collector layer so as to form an oxide layer in the second collector layer without oxidizing the covered part.

2. The method according to claim 1, wherein a material of the second collector layer is selected as less oxidizable than a material of the first collector layer.

3. The method according to claim 1, wherein a thickness dimension of the first collector layer is selected as greater than that of the second collector layer.

4. The method according to claim 1, wherein the thickness of the second collector layer is less than or equal to 20 nm.

5. The method according to claim 1, wherein a material is selected for the second collector layer having an electrical resistivity greater than that of a material of the first collector layer.

6. The method according to claim 1, wherein the second collector layer is configured to form a passivation layer during the heat treating.

7. The method according to claim 1, wherein the heat treating is a heat oxidation, at a temperature greater than or equal to 300° C.

8. The method according to claim 1, wherein forming the second collector layer comprises totally covering the first collector layer.

9. The method according to claim 1, further comprising:
removing part of the second collector layer after forming the first electrode, on at least part of the second collector layer not covered by the first electrode.

10. The method according to claim 1, comprising, after the heat treating:
forming a solid, active layer in contact with an upper face of the first electrode;
forming a second electrode in contact with an upper face of the solid, active layer; and
forming a second collector in electrical continuity with the second electrode.

11. The method according to claim 1, wherein a thickness dimension of the first collector layer is 4 to 6 times greater than the second layer.

12. The method according to claim 1, wherein the heat treating is a heat oxidation at a temperature greater than or equal to 500° C.

13. A method for producing a microelectronic device successively comprising:
forming a current collector on a face of a substrate by (a) forming a first collector layer on the face of the substrate and (b) forming a second collector layer covering at least part of the first collector layer to produce a covered part of the first collector layer;

forming a first electrode on, and in electrical continuity with, a first face of the second collector layer of the current collector; and heat treating the first electrode such that the second collector layer forms a passivation layer and protects the covered part during the heat treating and prevents the heat treating from oxidizing the covered part.

14. The method according to claim 13, wherein a thickness dimension of the first collector layer is selected as greater than that of the second collector layer.

15. The method according to claim 13, wherein the thickness of the second collector layer is less than or equal to 20 nm.

16. The method according to claim 13, wherein a material is selected for the second collector layer having an electrical resistivity greater than that of a material of the first collector layer.

17. The method according to claim 13, wherein the heat treating is a heat oxidation, at a temperature greater than or equal to 300° C.

18. The method according to claim 13, wherein forming the second collector layer comprises totally covering the first collector layer.

19. The method according to claim 13, further comprising:
removing part of the second collector layer after forming the first electrode, on at least part of the second collector layer not covered by the first electrode.

20. The method according to claim 13, comprising, after the heat treating:
forming a solid, active layer in contact with an upper face of the first electrode;
forming a second electrode in contact with an upper face of the solid, active layer; and
forming a second collector in electrical continuity with the second electrode.

21. The method according to claim 13, wherein a thickness dimension of the first collector layer is 4 to 6 times greater than the second layer.

22. The method according to claim 13, wherein the heat treating is a heat oxidation at a temperature greater than or equal to 500° C.

* * * * *